United States Patent
Engelvin et al.

(10) Patent No.: US 9,742,186 B2
(45) Date of Patent: Aug. 22, 2017

(54) ELECTRONIC EQUIPMENT ITEM COMPRISING A HOUSING AND AT LEAST ONE ELECTRONIC BOARD PROTECTED AGAINST LIGHTNING

(71) Applicant: Airbus Operations (SAS), Toulouse (FR)

(72) Inventors: Pierre-Louis Engelvin, Odars (FR); Patrice Lafont, Mons (FR)

(73) Assignee: Airbus Operations (SAS), Toulouse (FR)

( * ) Notice: Subject to any disclaimer, the term of this patent is extended or adjusted under 35 U.S.C. 154(b) by 0 days.

(21) Appl. No.: 15/164,223

(22) Filed: May 25, 2016

(65) Prior Publication Data
US 2016/0352097 A1    Dec. 1, 2016

(30) Foreign Application Priority Data
May 29, 2015   (FR) ...................................... 15 54879

(51) Int. Cl.
| | | |
|---|---|---|
| H02H 9/04 | (2006.01) | |
| H05K 7/14 | (2006.01) | |
| H02H 1/00 | (2006.01) | |
| H05K 5/00 | (2006.01) | |
| H05K 5/02 | (2006.01) | |

(52) U.S. Cl.
CPC .......... *H02H 9/044* (2013.01); *H02H 1/0038* (2013.01); *H05K 5/0021* (2013.01); *H05K 5/0069* (2013.01); *H05K 5/0247* (2013.01); *H05K 5/0256* (2013.01); *H05K 7/1439* (2013.01); *H05K 7/1461* (2013.01)

(58) Field of Classification Search
CPC ........... H02H 9/04; H02H 9/041; H02H 9/005
USPC ......................................................... 361/118
See application file for complete search history.

(56) References Cited

U.S. PATENT DOCUMENTS

| | | | | |
|---|---|---|---|---|
| 7,570,474 B1 * | 8/2009 | Hettermann | .............. | H05F 3/02 361/212 |
| 7,765,864 B2 * | 8/2010 | Bernus | ...................... | B64C 1/36 361/124 |
| 2005/0041362 A1 * | 2/2005 | Hall | ...................... | B64D 45/02 361/225 |
| 2009/0195135 A1 * | 8/2009 | Nemoz | ................ | H05K 7/1449 312/408 |

(Continued)

FOREIGN PATENT DOCUMENTS

| | | |
|---|---|---|
| EP | 0824302 | 2/1998 |
| FR | 2927222 | 8/2009 |

OTHER PUBLICATIONS

French Search Report, Apr. 14, 2016 priority document.

*Primary Examiner* — Dharti Patel
(74) *Attorney, Agent, or Firm* — Greer, Burns & Crain, Ltd.

(57) ABSTRACT

An electronic equipment item for an electronic system, comprising a housing, a backplane board, at least one daughterboard and at least one lightning protection board housed in the housing. A connector is fixed to the backplane board and configured to be connected to the rest of the electronic system. For each daughterboard there is provided one lightning protection board. For each lightning protection board, a first port is arranged to connect the lightning protection board to the backplane board, and a second port is arranged to connect the daughterboard to the lightning protection board.

5 Claims, 2 Drawing Sheets

(56) References Cited

U.S. PATENT DOCUMENTS

2012/0236457 A1* 9/2012 Yamakoshi ............ B64D 45/02
361/218
2014/0293497 A1* 10/2014 Foltz ........................ H05F 3/00
361/218

* cited by examiner

ELECTRONIC EQUIPMENT ITEM COMPRISING A HOUSING AND AT LEAST ONE ELECTRONIC BOARD PROTECTED AGAINST LIGHTNING

CROSS-REFERENCES TO RELATED APPLICATIONS

This application claims the benefit of the French patent application No. 1554879 filed on May 29, 2015, the entire disclosures of which are incorporated herein by way of reference.

BACKGROUND OF THE INVENTION

The present invention relates to an electronic equipment item comprising a housing and at least one electronic board protected against lightning, and an aircraft comprising such an electronic equipment item.

An aircraft comprises many electronic equipment items. A certain number of electronic equipment items comprise a housing in which there are a backplane board and a plurality of electronic boards, called daughterboards. Each daughterboard is fixed to the backplane board using an appropriate port. The electronic equipment item also has a connector which is electrically connected to the backplane board and which makes it possible to electrically connect the backplane board to the rest of the electronic system of the aircraft.

To protect the components present in the electronic equipment item, the latter also comprises a lightning protection board. This lightning protection board takes the form of a printed circuit onto which are fixed electronic components provided to serve as fuses and prevent the passage of the electrical currents generated by lightning to the daughterboards.

Currently, various arrangements are provided, and while these various arrangements are satisfactory from the safety viewpoint, they are not satisfactory from a bulk or maintenance point of view.

A first arrangement comprises inserting the lightning protection board between the backplane board and the connector. This arrangement leads to the creation of a separating space between the connector and the backplane board. This separating space containing the lightning protection board significantly increases the bulk of the electronic equipment item. Furthermore, replacing the lightning protection board entails dismantling all the daughterboards, then the backplane board, in order to be able to finally access the lightning protection board.

A second arrangement comprises incorporating a lightning protection board on each daughterboard. The daughterboard, of elongate form, comprises a first part comprising the components relating to the daughterboard itself and a second part comprising the components relating to the lightning protection board. This arrangement also leads to an increase in the bulk of the electronic equipment item because of the elongation of the daughterboard. Furthermore, when a lightning protection board is damaged, the entire daughterboard has to be replaced, which represents a not inconsiderable cost.

SUMMARY OF THE INVENTION

One object of the present invention is to provide an electronic equipment item comprising a housing and at least one electronic board which does not have the drawbacks of the prior art and which, in particular, allows for easy maintenance.

To this end, there is provided an electronic equipment item for an electronic system, the electronic equipment item comprising:
a housing,
a backplane board housed in the housing,
a connector fixed to the backplane board and configured to be connected to the rest of the electronic system,
at least one daughterboard housed in the housing, and
for each daughterboard, a lightning protection board housed in the housing,
the electronic equipment item being characterized in that for each lightning protection board,
a first port is arranged to connect the lightning protection board to the backplane board, and
a second port is arranged to connect the daughterboard to the lightning protection board.

Such an arrangement allows for a cost and time saving in maintenance and in the replacement of the lightning protection board when the latter has been damaged.

Advantageously, the first port and the second port have perpendicular directions of fitting.

Advantageously, the second port is of the type with fitting perpendicular to the lightning protection board.

Advantageously, for each pair of a lightning protection board and a daughterboard, the electronic equipment item has an independent housing in which the protection board and the daughterboard are fixed.

The invention also provides an aircraft comprising an electronic system having at least one electronic equipment item according to one of the preceding variants.

BRIEF DESCRIPTION OF THE DRAWINGS

The features of the invention mentioned above, and others, will become more clearly apparent on reading the following description of an exemplary embodiment, the description being given in relation to the attached drawings, in which.

DETAILED DESCRIPTION OF THE PREFERRED EMBODIMENTS

Figure 1:
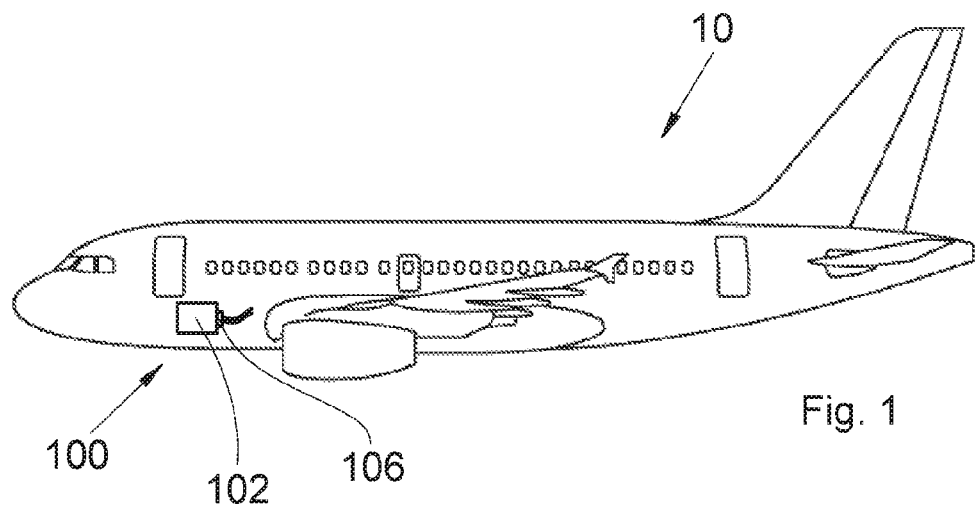
FIG. 1 represents a side view of an aircraft comprising an electronic equipment item according to the invention.

FIG. 1 shows an aircraft 10 comprising an electronic system which has at least one electronic equipment item 100 having a housing 102 and at least one electronic board (204, FIG. 2), called daughterboard and housed in the housing 102. The electronic equipment item 100 comprises a connector 106 which makes it possible to electrically connect the electronic equipment item 100 to the rest of the electronic system of the aircraft 10.

Figure 2:
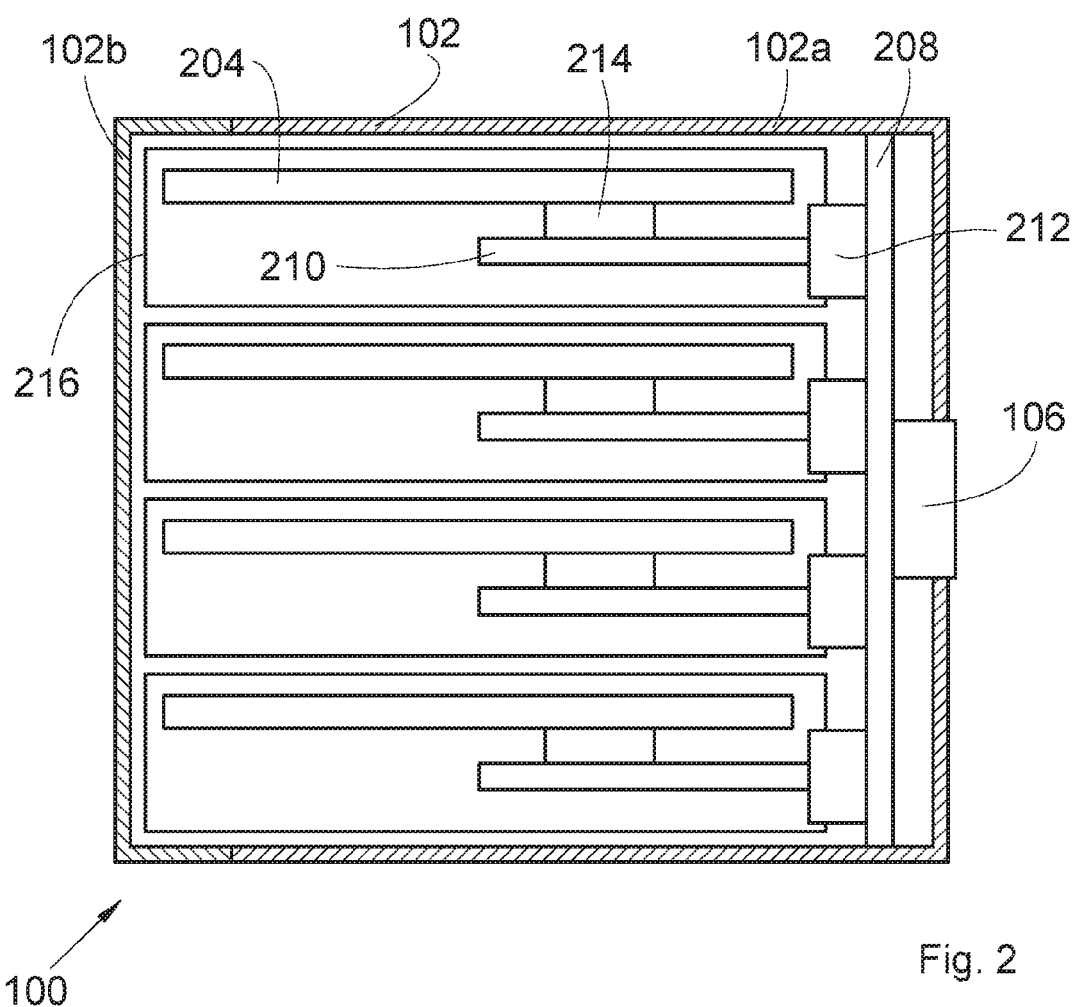
FIG. 2 is a plan view in cross section of an electronic equipment item according to the invention.
Figure 3:
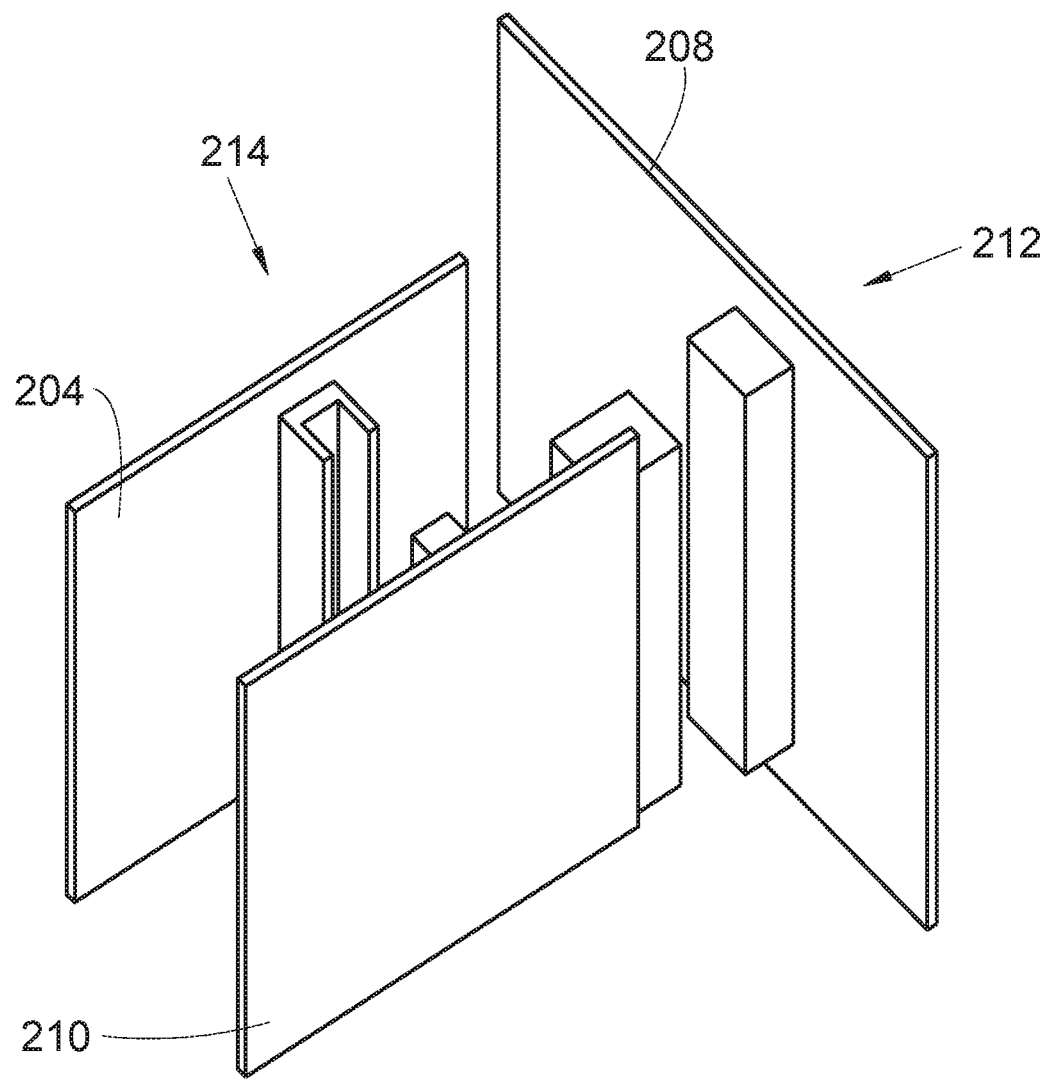
FIG. 3 is an exploded perspective view of a part of the electronic equipment item according to the invention.

FIG. 2 shows the electronic equipment item 100 in plan view and in cross section through a plane parallel to the top face of the housing 102 and FIG. 3 shows a part of the electronic equipment item 100 in exploded view.

The electronic equipment item 100 also comprises a backplane board 208 housed in the housing 102 and to which the connector 106 is fixed.

The electronic equipment item 100 also comprises, for each daughterboard 204, a lightning protection board 210 which is also housed in the housing 102.

The electronic equipment item 100 also comprises, for each lightning protection board 210, a first port 212 arranged to removably connect the lightning protection board 210 to the backplane board 208, and a second port 214 arranged to removably connect the daughterboard 204 to the lightning protection board 210. In this document, the connection between two boards is defined as being removable if the separation of the two boards is performed without the destruction of one or other of the two boards.

Thus, when a lightning protection board 210 has to be replaced, it is sufficient to remove the lightning protection board 210 from the first port 212 and to detach it from the second port 214 to separate it from the daughterboard 204 and thus be able to replace it easily.

This arrangement makes it possible to replace only the damaged lightning protection board 210 without replacing the associated daughterboard 204. This arrangement also allows for a time saving since there is no need to dismantle the backplane board 208. Furthermore, each lightning protection board 210 can be optimized for the daughterboard 204 which is associated with it.

In the embodiment of the invention presented in FIG. 2, the housing 102 comprises a front part 102a which bears the connector 106, the backplane board 208, the lightning protection boards 210 and the daughterboards 204, and a rear part 102b which is fixed removably to the front part 102a and which, when it is removed, allows access to the interior of the housing 102.

For a space saving, the first port 212 and the second port 214 have perpendicular directions of fitting.

The first port 212 is of the type with a fitting perpendicular to the backplane board 208. That is to say, the lightning protection board 210 is fixed to the backplane board 208 by displacement along a direction at right angles to the large surface of the backplane board 208.

The second port 214 is of the type with fitting perpendicular to the lightning protection board 210. That is to say, the daughterboard 204 is fixed to the lightning protection board 210 by displacement along a direction at right angles to the large surface of the lightning protection board 210.

Each port 212, 214 allows for the connection of two of the boards 208, 210, 204 of a pair together. In the embodiment of the invention presented in FIG. 3, each port 212, 214 comprises a part secured to a first board of the pair and a second part secured to the second board of the pair. For each port 212, 214, one part is a female connector and another part is a male connector which is introduced into the female connector.

For easier handling of the lightning protection board 210 and of the daughterboard 204, the electronic equipment item 100 has, for each pair of a lightning protection board 210 and a daughterboard 204, an independent housing 216 in which the lightning protection board 210 and the daughterboard 204 are fixed. To ensure the connection of the first port 212, the independent housing 216 has a window which allows the passage of the end of the lightning protection board 210 and the part of the first port 212 attached to the lightning protection board 210 which is provided to cooperate with the part of first port 212 attached to the backplane board 208.

The fixing of the lightning protection board 210 and of the daughterboard 204 in the independent housing 216 is ensured, for example, by the fitting of spacers and screws.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An electronic equipment item for an electronic system, the electronic equipment item comprising:
 a housing,
 a backplane board housed in the housing,
 a connector fixed to the backplane board and configured to be connected to a rest of the electronic system,
 at least one daughterboard housed in the housing, and
 for each daughterboard, a lightning protection board housed in the housing,
 wherein, for each lightning protection board,
 a first port is arranged to connect the lightning protection board to the backplane board, and
 a second port is arranged to connect the daughterboard to the lightning protection board.

2. The electronic equipment item according to claim 1, wherein the first port and the second port have perpendicular directions of fitting.

3. The electronic equipment item according to claim 2, wherein the second port is of the type with a fitting perpendicular to the lightning protection board.

4. The electronic equipment item according to claim 1, further comprising, for each pair of a lightning protection board and a daughterboard, an independent housing in which the lightning protection board and the daughterboard are fixed.

5. An aircraft comprising an electronic system having at least one electronic equipment item according claim 1.

* * * * *